United States Patent [19]

Easter

[11] 4,216,441
[45] Aug. 5, 1980

[54] ASTABLE MULTIVIBRATOR CIRCUIT
[75] Inventor: Finis C. Easter, Canoga Park, Calif.
[73] Assignee: RCA Corporation, New York, N.Y.
[21] Appl. No.: 973,451
[22] Filed: Dec. 26, 1978
[51] Int. Cl.$^2$ ............................................ H03K 3/282
[52] U.S. Cl. ................................ 331/111; 331/113 R
[58] Field of Search ............................ 331/111, 113 R

[56] References Cited
U.S. PATENT DOCUMENTS
3,737,731  6/1973  Zeewy ................................. 331/111

Primary Examiner—Siegfried H. Grimm
Attorney, Agent, or Firm—Samuel Cohen; Joseph D. Lazar; Raymond E. Smiley

[57] ABSTRACT

An astable multivibrator includes a first transistor a single capacitor arranged in a time constant circuit, coupled to the emitter of the transistor and a potential divider circuit coupled to the base of the transistor to apply a selectable portion of a bias supply thereto. A circuit including another transistor of polarity opposite to that of the first transistor responds to the first transistor in its conductive or non-conductive state for determining the portion of potential applied to the first transistor such as to drive the transistor into greater conduction when it is conducting and further from conduction when it is non-conducting. The threshold levels of the transistors track the voltage supply, which may be varied, such that the frequency and duty factor of the multivibrator are invariant with changes in voltage supply value.

6 Claims, 1 Drawing Figure

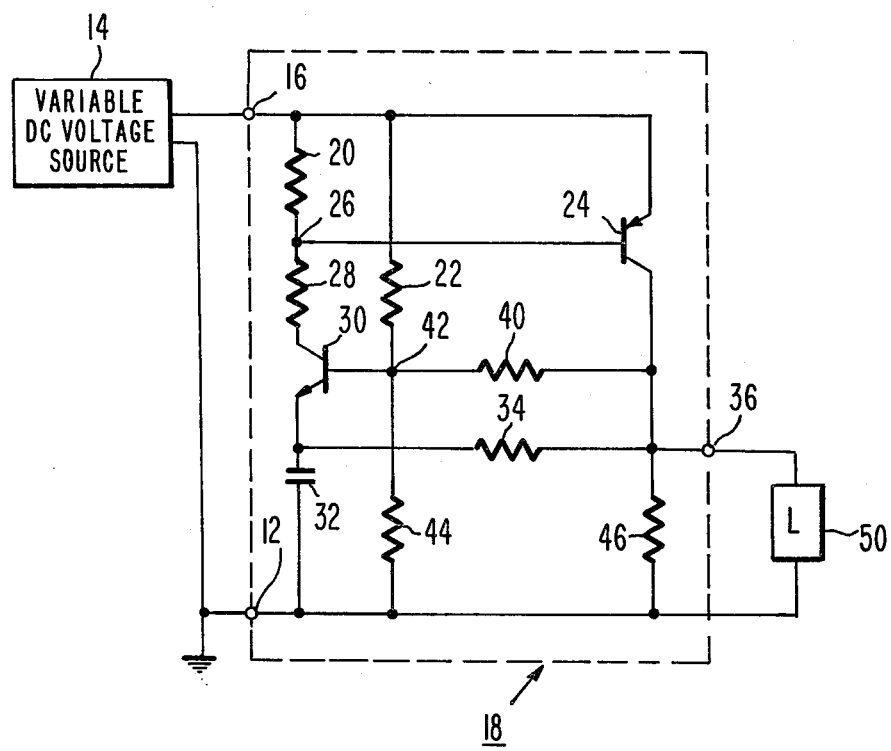

ASTABLE MULTIVIBRATOR CIRCUIT

BACKGROUND OF THE INVENTION

A number of astable multivibrator circuits are known for periodically interrupting power to a load. The known circuits typically include two transistors of the same polarity and two capacitors and resistors coupled respectively from the base of one transistor to the collector of the other for controlling frequency and duty factor of the circuit. The frequency of such circuits depends on the value of both capacitors and the duty factor depends on their ratio of capacitance. In such circuits if the two capacitors are at opposite tolerance limits, the duty factor will undesirably differ substantially from the nominal design value. Such capacitors used in time constant circuits are usually of microfarad or greater capacity levels which make the capacitors rather large for use with integrated circuits. It would therefore be desirable to eliminate the need for one of the capacitors.

Further such prior art multivibrator circuits typically operate from a fixed voltage supply, whereas there is sometimes a need for a multivibrator circuit that operates at a substantially constant duty factory and frequency irrespective of changes in voltage supply.

SUMMARY OF THE INVENTION

The collector and emitter of a first transistor are connected respectively to a first resistance means and a capacitor. The free ends of the resistance means and capacitor are coupled, respectively, to a first and a second terminal adapted to receive a voltage potential therebetween.

A potential divider means is coupled between the first and second terminals and adapted to provide a portion of the potential to the transistor base. The divider means includes means responsive to a control voltage generated between the collector and first terminal for controlling the voltage at the base.

The control voltage has a first value when the transistor is in its conductive state and a second value when it is in its non-conductive state. The first and second values of the control voltages cause, respectively, a first portion of the potential or a second different portion of the potential to be applied to the base electrode. The first portion causes a relatively greater potential difference between the base electrode and second terminal, than the difference caused by the second portion.

The control voltage, when at its first value, causes the charging of the capacitor until the transistor becomes non-conductive. A second resistance means is coupled in parallel with the capacitor and is responsive to the transistor being non-conductive for discharging the capacitor to a value at which the transistor becomes conductive.

BRIEF DESCRIPTION OF THE DRAWING

The sole FIGURE is an astable multivibrator is electric schematic form in accordance with the instant invention.

DETAILED DESCRIPTION OF A PREFERRED EMBODIMENT

Refer to the sole FIGURE. A source of variable DC potential 14 is coupled to a first terminal 16 and a second terminal 12 of an astable multivibrator circuit 18 to provide a positive potential at terminal 16 relative to that at terminal 12. Terminal 16 is connected to one end of each of resistors 20 and 22 and to the emitter of a PNP transistor 24.

The base of transistor 24 is connected to a junction control terminal 26 to which are connected resistors 20 and 28 comprising a first means providing a resistance. Resistor 20, in conventional manner, provides a current path for leakage currents in transistor 24 to aid in keeping transistor 24 nonconductive when it is to be nonconductive. Resistor 28 is connected to the collector of an NPN transistor 30. Capacitor 32 is connected between the emitter of transistor 30 and terminal 12. Resistor 34 is coupled between the emitter of transistor 30 and output terminal 36 of multivibrator 18. One end of a resistor 40 and the collector of transistor 24 are also coupled to terminal 36. The other end of resistor 40 is connected to a junction 42 to which the base of transistor 30, one end of resistor 22 and one end of an additional resistor 44 are connected. The other end of resistor 44 is connected to terminal 12. A resistor 46 is connected between terminals 36 and 12. A load 50 external to multivibrator 18 is also connected between terminal 36 and 12. Load 50 may, for example, be one or more panel lamp bulbs on an aircraft instrument panel. The purpose of resistor 46 is to permit tests of multivibrator 18 in the absence of a load 50.

Resistors 22, 44, and 40, along with resistor 46 and load 50 and transistor 24, comprise a potential divider means to provide base bias voltage for transistor 30. The potential divider supplies only a portion of the voltage at terminal 16 to junction 42 and, therefore, the base of transistor 30. Junction 42 receives one or another of two different portions depending on whether transistor 24 is in conductive or non-conductive state. When transistor 24 is conductive, resistor 40 is, in effect, placed in parallel with resistor 22 providing, at junction 42, a relatively high portion of the voltage appearing at terminal 16. When transistor 24 is non-conductive, resistor 40 is essentially in parallel with resistor 44, since the resistance of load 50 is very low relative to the resistance of resistor 40. With resistor 40 in parallel with resistor 44, there is provided at junction 42 a relatively low portion of the voltage appearing at terminal 16. The operation of the potential divider in context with the rest of the multivibrator circuit will be described shortly.

Capacitor 32 is arranged to be in one or the other of two time constant circuits depending on whether transistors 24 and 30 are conductive or non-conductive. They are essentially simultaneously both conductive in saturation or both non-conductive. When transistors 24 and 30 are non-conductive, capacitor 32, resistor 34 and load 50, in parallel with resistor 46, form a time constant circuit for determining the rate of discharge of capacitor 32. When each of transistors 24 and 30 is conductive in saturation and therefore acting essentially as a short circuit, capacitor 32 and resistors 28 and 34 form a time constant circuit for determining the rate of charge of capacitor 32. Since resistor 20 is shunted by the base-emitter junction of transistor 24, the resistor is not part of the time constant circuit.

Operation of the circuit is as follows. It will be assumed initially that no power is applied to the circuit at terminal 16 and that capacitor 32 is fully discharged. When power is applied to terminal 16, junction 42 is at some positive potential, while capacitor 32, having been fully discharged, supplies ground potential at the emitter of transistor 30. Thus a positive voltage appears across the base-emitter junction of transistor 30 which therefore causes it to become conductive and is saturated, due to current through resistor 22. With transistor 30 in saturation, its collector is essentially at its emitter potential, initially ground and, therefore, resistors 20 and 28 act as a potential divider between terminal 16 and ground to supply a voltage to the base of transistor 24 which is below that at the emitter thereof. Thus, transistor 24 becomes conductive and sufficient current is suplied by resistor 28 to saturate transistor 24. When transistor 24 is saturated, substantially its emitter voltage appears at its collector and thus at the end of resistor 40 connected thereto. Resistor 40 provides positive feedback to transistor 30 further increasing its base drive current.

When transistor 24 is saturated its collector is substantially at the potential of terminal 16. Thus, the potential of terminal 16 appears at terminal 36 and therefore at load 50 to supply power thereto. Further, when transistor 24 is in saturation, resistor 40 is essentially in parallel with resistor 22 so that a potential divider comprising resistor 44 in series with resistors 22 and 40 in parallel is established between terminal 16 and terminal 12. A voltage determined by the values of the voltage divider components and the value of voltage at terminal 16 exists at junction 42 and therefore the base of transistor 30. Actually, so long as transistor 30 is in saturation, the voltage at its base is determined by that at its emitter, but the potential divider determines the upper limit of the voltage.

When transistor 30 is conducting, capacitor 32 begins to charge at a rate in volts per second determined by the charge already on the capacitor and the values of resistors 28 and 34 and the voltage at terminal 16. This is true since with transistor 24 in saturation, its emitter, base and collector and the end of resistor 40 which is connected to the collector, are at substantially the voltage at terminal 16. It should be noted that with transistor 24 in saturation, resistors 28 and 34 are substantially in parallel, each having a voltage applied across it equal to the potential difference between the potential of the emitter of transistor 30 and to terminal 16 decreased by the base-to-emitter potential of either transistor 24 and 30. A change in either resistor 28 or 34 or capacitor 32 would affect the charging rate, but since as will be described below, resistor 34 is used to determine the discharge rate, resistor 28 is the critical element to control charging time. In one exemplary embodiment, the value of resistor 28 is 47 ohms while that of resistor 34 is 750 ohms. Therefore, the effect of resistor 34 in the charging circuit can be ignored. The description to this point reflects only the start up procedure of circuit 18. The following describes a typical cycle.

Capacitor 32 continues to charge until the current through resistor 28 is insufficient to maintain transistor 24 in saturation and the transistor 30 base-emitter voltage is so low that transistor 30 goes out of saturation. Which transistor, 30 or 24, goes out of saturation first is a matter of component values and tolerances and is not critical to the operation.

When transistor 24 is no longer operating in saturation, the collector-to-emitter voltage thereof increases causing the collector voltage relative to ground to decrease. Thus, the voltage at junction 42 (the base voltage of transistor 30) decreases. Therefore, transistor 30 and transistor 24 are regeneratively rendered non-conductive, essentially simultaneously. When transistor 24 becomes non-conductive, the series combination of load 50 and resistor 40 is placed in parallel with resistor 44. Since the resistance of resistor 40 is substantially greater than that of a typical load 50 comprised of several lamps in parallel, the resistance of load 50 for purposes of discussion may be assumed to be zero such that resistor 46 has no effect on the circuit operation.

With resistor 40 and resistor 44 in parallel, the voltage divider comprised of resistor 22 in series with the parallel combination of resistors 40 and 44 provides a lower voltage at junction 42 than is provided thereat when transistor 24 is conducting, when resistors 40 and 22 are essentially in parallel. Therefore, when transistor 24 becomes non-conductive the voltage across capacitor 32 and thus the emitter of transistor 30 is substantially above that at the base thereof. Therefore, capacitor 32, begins to discharge via resistor 34 and load 50. For a given value of capacitor 32 the value of resistor 34 determines the rate of discharge. It should be noted that changing the value of capacitor 34, although affecting the discharge time, also affects the charging time proportionally such that the duty factor (ratio of circuit on time on time + off time) is not altered by a change of capacitor value. Thus, the value of capacitor 32 affects only the frequency of circuit 18, not the duty factor thereof, while the values of resistors 34 and 28 affect the duty factor of circuit 18.

Capacitor 32 discharges through resistor 34 and load 50 until the voltage at the emitter of transistor 30 goes below that at the base. At that time transistor 30 becomes conductive causing current once again to flow through resistor 28 to the base of transistor 24 which therefore becomes conductive which provides current through resistor 40 to the base of transistor 30. This process continues regeneratively until both transistor 24 and 30 become saturated and the charging of capacitor 32 repeats as described above.

It is important to note that, for given values of resistors 28 and 34 and capacitor 32, frequency and duty factor of circuit 18 are invariant regardless of the value of operating voltage at terminal 16. This is true since the voltage at the emitter, base and collector of transistors 24 and 30 depend on the bias voltage at terminal 16. Thus, for example, although the RC time constant circuit of resistor 28 and capacitor 32 charges faster at higher potential values at terminal 16 it still takes the same amount of time to rise to a level which causes transistor 24 to go out of saturation as is true when terminal 16 is at a lower value and the rate of charge of the capacitor 32 is lower.

It will be understood that the polarity of transistors 24 and 34 may be reversed if a power supply 14 of opposite polarity is used.

In one working embodiment the following values are utilized:

| Component | Value |
| --- | --- |
| Resistor 20 | 220 ohms |
| Resistor 22 | 470 ohms |
| Resistor 28 | 47 ohms |
| Resistor 34 | 750 ohms |
| Resistor 40 | 820 ohms |
| Resistor 44 | 470 ohms |
| Resistor 46 | 100 ohms |
| Capacitor 32 | 1.0 mtd |
| Transistor 24 | 2N5195 |
| Transistor 30 | 2N2222A |
| Supply 14 | 6-35 Volts DC |

What is claimed is:

1. An astable multivibrator of the type in which a transistor alternately is in a conductive or nonconductive state, comprising in combination:

a transistor having base, emitter and collector electrodes;

a first terminal and a second terminal adapted to receive therebetween a source of direct current potential;

first resistance means providing a predetermined value of resistance coupled to said terminal and said collector electrode;

a capacitor coupled between said emitter electrode and said second terminal, said capacitor being adapted to be charged when said transistor is in a conductive state at a charging rate which is a function of its value and that of said first resistance means;

potential divider means coupled between said first and second terminals and adapted to provide a portion of said potential to said base electrode;

said divider means including means responsive to a control voltage generated between said collector and said first terminal for controlling the voltage at said base, said control voltage having a first value when said transistor is in its conductive state and a second value when it is in its non-conductive state, the first and second values of said control voltage causing, respectively, a first portion of said potential or a second different portion of said potential to be applied to said base electrode, said first portion causing a relatively greater potential difference between said base electrode and said second terminal than the potential difference caused by said second portion;

said control voltage of said first value causing said capacitor to be charged until said transistor becomes non-conductive, and;

second resistance means providing a resistance coupled in parallel with said capacitor and responsive to said transistor in its non-conductive state for discharging said capacitor to a value at which said transistor becomes conductive.

2. The combination as set forth in claim 1 wherein said potential divider means comprises a second transistor of polarity opposite to that of the first transistor and having emitter, base and collector electrodes, and further comprises first, second and third resistors, said first resistor being connected between said first terminal and base of said first transistor, said second resistor being connected between said second terminal and base of said first transistor, said third resistor being connected between said collector of said second transistor and base of said first transistor, said emitter electrode of said second transistor being coupled to said first terminal, said base electrode thereof being coupled to said control voltage responsive means, said collector electrode thereof being coupled to said second resistance means to thereby control the portion of voltage provided to said base of said first transistor, said second transistor being arranged to be conductive when said first transistor is conductive and nonconductive when said first transistor is nonconductive.

3. The combination as set forth in claim 2, wherein said first resistance means comprises fourth and fifth resistors, said fourth resistor being connected between said first terminal and said base of said second transistor, said fifth resistor being connected between said base of said second transistor and said collector of said first transistor.

4. The combination as set forth in claim 3, wherein said second resistance means comprises a seventh resistor and an eighth resistor, said seventh resistor being connected between said emitter of said first transistor, to which is connected said capacitor, and the collector of said second transistor, said eighth resistor being connected between said collector of said second transistor and said second terminal.

5. The combination as set forth in claim 4, further including a load in parallel with said eighth resistor for receiving power when said second transistor is conductive and receiving substantially no power when said second transistor is nonconductive.

6. The combination as set forth in claim 5, further including means coupled between said first and second terminals to provide therebetween a variable source of direct potential.

* * * * *